United States Patent [19]

Sadigh-Behzadi

[11] Patent Number: 5,236,098
[45] Date of Patent: Aug. 17, 1993

[54] SOCKET AND HEADER ELECTRICAL CONNECTOR ASSEMBLY

[75] Inventor: Amir-Akbar Sadigh-Behzadi, Van Nuys, Calif.

[73] Assignee: Thomas & Betts Corporation, Bridgewater, N.J.

[21] Appl. No.: 850,745

[22] Filed: Mar. 13, 1992

[51] Int. Cl.⁵ .............................................. H05K 5/00
[52] U.S. Cl. ................................. 220/4.02; 220/4.26; 220/23.6; 206/503; 206/821
[58] Field of Search ................ 220/4.02, 4.03, 4.26, 220/23.6; 206/328, 503, 821; 357/69, 70; 312/111

[56] References Cited

U.S. PATENT DOCUMENTS

| | | | |
|---|---|---|---|
| 3,391,384 | 7/1968 | Hughes | 339/196 |
| 3,479,634 | 11/1969 | Pritulsky | 339/17 |
| 3,513,248 | 5/1970 | Bright et al. | 220/4.26 |
| 3,699,394 | 10/1972 | Schuler | 317/100 |
| 3,924,918 | 12/1975 | Friend | 339/17 |
| 4,070,081 | 1/1978 | Takahashi | 339/91 |
| 4,085,998 | 4/1978 | Owens | 339/258 |
| 4,266,714 | 5/1981 | Crang | 206/821 |
| 4,415,077 | 11/1983 | Murphy | 220/4.26 |
| 4,542,260 | 9/1985 | Pearce | 174/52 |
| 4,582,375 | 4/1986 | Keller | 339/17 |
| 4,619,365 | 10/1986 | Kelly et al. | 201/821 |
| 4,629,267 | 12/1986 | Stepan | 339/17 |
| 4,799,893 | 1/1989 | Ogawa et al. | 439/76 |
| 4,857,002 | 8/1989 | Jensen et al. | 439/76 |
| 4,896,926 | 1/1990 | Verholt | 206/821 |
| 4,952,529 | 8/1990 | Grider | 437/209 |
| 5,000,701 | 3/1991 | Norden | 439/680 |

FOREIGN PATENT DOCUMENTS 3002515 1/1980 Fed. Rep. of Germany .
64-14996 1/1989 Japan .

Primary Examiner—Joseph Man-Fu Moy
Attorney, Agent, or Firm—Robert M. Rodrick; Salvatore J. Abbruzzese

[57] ABSTRACT

A connector assembly for electrically connecting an electronic apparatus to a printed circuit board includes a matable socket connector and header connector. The socket connector includes a lower housing which supports the electronic apparatus and which is capable of containing an insulative curable potting compound. A plurality of electrical contacts is supported by the lower housing in electrical engagement with the electronic apparatus. A cover is supportable over the lower housing for enclosing the housing. The electronic apparatus is supported within the socket connector in position so that the curable potting compound may completely surround the electronic apparatus providing an environmental seal. The socket connector is insertable into the header connector supported on the printed circuit to establish electrical connection therebetween.

1 Claim, 4 Drawing Sheets

FIG. 2
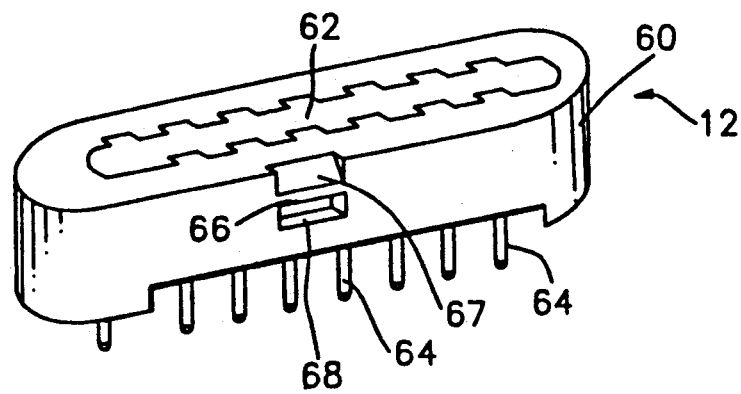
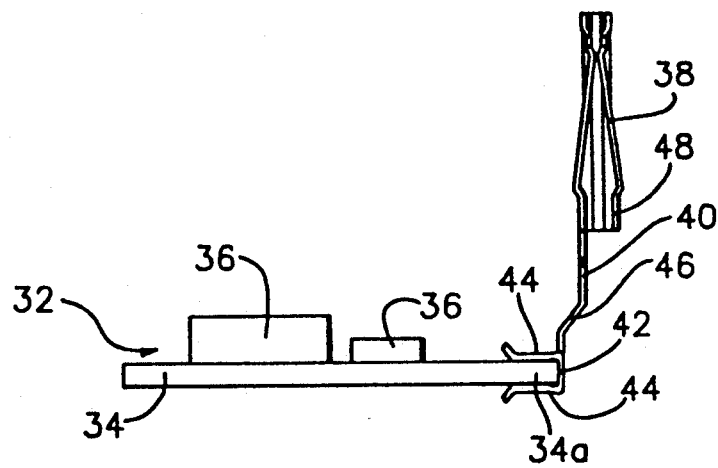
FIG. 3
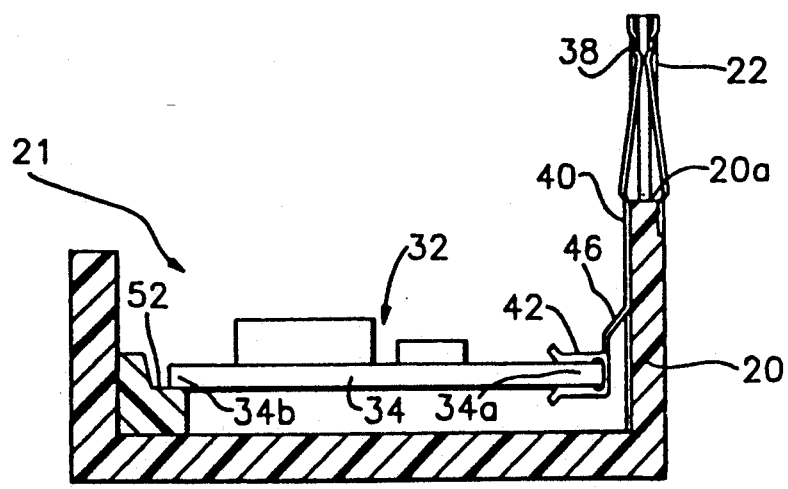
FIG. 4

SOCKET AND HEADER ELECTRICAL CONNECTOR ASSEMBLY

FIELD OF THE INVENTION

The present invention relates to a connector assembly including an interconnectable socket connector and header connector. More particularly, the present invention relates to a connector assembly for easily releasably connecting an electronic apparatus housed in a socket connector to a header connector.

BACKGROUND OF THE INVENTION

In establishing electrical connection between various components, especially in the electronics environment, socketing has long been used as an expedient. Socketing entails providing a pair of connectors which are matable. One connector of the pair typically houses an electronic apparatus while the other connector of the pair is mounted and electrically secured to an object to which connection is desired such as a printed circuit board. Where connection is desired between an electronic apparatus and a printed circuit board, the first connector is usually referred to as a socket connector while the second connector is usually referred to as a header connector.

In addition to providing ease of interconnectability, the socket connector is also used to provide physical protection to the electronic apparatus housed therein. Socket connectors may be constructed which totally enclose an electronic apparatus housed therein to prevent external contaminants from adversely affecting the electrical performance of the apparatus. However, in certain extremely harsh environments, such as those found in the engine compartment of an automobile, merely covering the electronic apparatus may be insufficient protection.

The art has seen the use of encapsulation techniques where the electronic apparatus is encapsulated or potted, with a curable potting compound. The potting compound is typically provided in a fluid state, which after being poured around the electronic apparatus, hardens or cures to a solid state, thereby providing an environmental seal around the electronic apparatus. Socket connectors, which support such electronic apparatus, must be also capable of containing a curable potting compound in such a manner that complete encapsulation of the electronic apparatus is achieved.

In order to facilitate mass production of such socketed connectors, the socket connector should support the electronic apparatus in such a manner that it is relatively easy to completely encapsulate with potting material.

SUMMARY OF THE INVENTION

It is an object of the present invention to provide a socketable connector assembly which permits the releasable matable interconnection of electronic components.

It is a further object of the present invention to provide a connector assembly for electrically connecting an electronic apparatus supported in a socket connector to a header connector supported on a printed circuit board, and where the socket connector is easily releasable from the header connector.

In the efficient attainment of these and other objects, the present invention provides a connector assembly for electrically connecting an electronic apparatus to a printed circuit board. The assembly includes a socket connector and a matable header connector. The socket connector includes an insulative open-sided container which is capable of retaining a curable potting compound. A plurality of electrical contacts are supported by the container having first ends within the container which engage and support the electronic apparatus. Opposed second ends of the contacts extend exteriorly of the connector. Means is provided for supporting the electronic apparatus in a position within the container to permit the electronic apparatus and the first ends of the contacts to be surrounded by the potting compound. A cover is supportable over the container to enclose the potted electronic apparatus. The header connector is securable to the printed circuit board and includes an insulative housing and plural electrical terminals electrically engageable with the socket contacts to establish electrical connection therebetween.

As more particularly shown by way of the preferred embodiment, the invention provides for the interconnection of a pair of components. A first component housing and a second component housing are interconnectable. Cooperative latching means secures the first component housing to the second component housing. The latching means further includes a latch member connected to the first housing by a pivotal hinge. The latch member includes a pair of elongate arms depending from the hinge. Ends of the arms include engagement ledges thereon. A pair of manually graspable tabs extend from the hinge and are moveable about the hinge toward and away from one another to cause corresponding relative movement of the ends of the latch arms. The tabs are also moveable in unison about the hinge toward and away from the first housing to cause corresponding movement in unison of the ends of the latch arms. The second housing includes a ledge engaging protrusion formed thereon for engagement with the ledges of the latch member. The ledges of the latch member are disengagable with the protrusion upon movement of the tabs about the hinge either toward or away from one another or in unison toward and away from the first housing.

BRIEF DESCRIPTION OF THE DRAWINGS

FIG. 2 is a perspective showing of a header connector of the connector assembly of the present invention.

FIG. 3 shows an electrical contact used in the socket connector shown in FIG. 1, attached to an electronic apparatus.

FIG. 4 shows the socket contact and the electrical apparatus shown in FIG. 2, supported by a housing of the socket connector of FIG. 1.

DETAILED DESCRIPTION OF THE PREFERRED EMBODIMENTS

Figure 1:
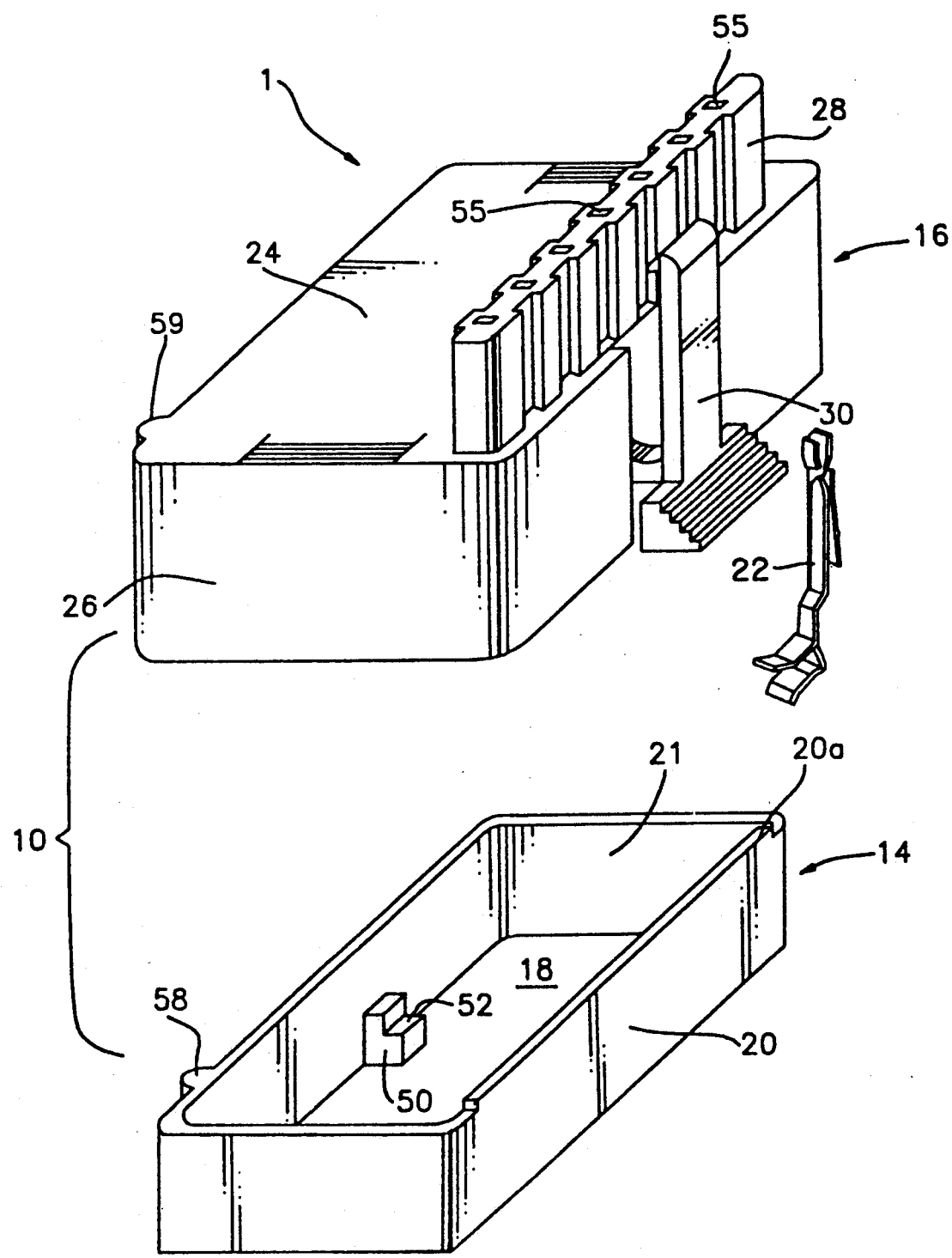
FIG. 1 shows in exploded perspective view, the socket connector of the connector assembly of the present invention.

The electrical connector assembly 1 of the present invention is shown in FIGS. 1 and 2. Connector assembly 1 includes a socket connector 10 shown in FIG. 1 and an intermatable header connector 12 shown in FIG. 2. Socket connector 10 is formed of a suitable electrically insulative plastic material and as shown in FIG. 1 includes a lower housing 14 and an upper cover 16. Lower housing 14 is generally rectangular in shape having a planar bottom wall 18 and an upstanding side wall 20 extending about the perimeter of bottom wall 18. The upper surface of lower housing 14 is open thereby forming an open-ended container which is closed by cover 16. Lower housing 14 and side wall 20 define an internal cavity 21.

Socket connector 10 further includes plural electrical contacts 22, one of which is shown in FIG. 1. Contacts 22 are positioned on lower housing 14 in a manner which will be described in further detail hereinbelow.

Cover 16 is also generally rectangular in shape, having a planar upper wall 24 and a depending side wall 26 extending perimetrically around upper wall 24. Cover 16 is constructed to fit over lower housing 14 to enclose cavity 21 thereof. Cover 16 includes an upwardly extending portion 28, which permits accommodation of contacts 22 as will be described in further detail hereinbelow. Cover 16 also includes a latch 30 mounted on side wall 20. Latch 30 is manually operable to secure and lock socket connector 10 to header connector 12, as will be described in further detail hereinbelow.

Referring additionally to FIG. 3, socket connector 10 is designed to house an electronic apparatus 32 which may include a printed circuit board 34 upon which are mounted various electronic devices 36. Electrical contacts 22 are used to establish electrical connection with electronic apparatus 32. Contacts 22 are elongate members formed of suitably electrically conductive material, and include a first end conventionally formed into a pin receiving socket 38. Each contact 22 further includes an elongate central portion 40 extending from socket 38 to a connecting clip element 42 at the opposite end thereof. Clip element 42 is used to engage an edge 34a of printed circuit board 34. Clip element 42 includes upper and lower fingers 44 which engage opposed surfaces of printed circuit board 34 about edge 34a. Fingers 44 typically electrically engage metallic traces (not shown) on the surfaces of printed circuit board 34 to establish electrical connection therebetween. Central portion 40 of contact 22 includes an angled transition region 46 which horizontally spaces clip element 42 from socket 38.

In the present embodiment, it is contemplated that socket connector 10 will employ eight contacts 22. The contacts 22 are spaced along edge 34a of printed circuit board 34. The clip elements 42 of contacts 22 secure contacts 22, both mechanically and electrically to printed circuit board 34. It of course may be appreciated that a socket connector may be constructed which could support a various number of contact 22 as may be needed for a particular application.

Referring now to FIG. 4, the electronic apparatus 32 and contacts 22 which are secured thereto, are inserted into lower housing 14. Socket contact 22 includes a wall engaging portion 48, shown in FIG. 3, which clips onto an upper edge of 20a of side wall 20. The engagement of each of contacts 22 with the upper edge 20a of side wall 20 secures the contacts thereto and also fixably supports electronic apparatus 32 within cavity 21 of lower housing 14.

Contacts 22 are constructed so that central portion 40 thereof extends down toward bottom wall 18, but terminates in clip element 42 at a location spaced from bottom wall 18. Thus, as shown in FIG. 4, clearance is provided between printed circuit board 34 and bottom wall 18. Additionally, as shown in FIGS. 1 and 4, lower housing 14 includes a platform 50 extending upwardly from bottom wall 18 at a location spaced from contacts 22. Platform 50 includes a board bearing surface 52, which is substantially parallel to bottom wall 18 and which supports an edge 34b of printed circuit board 34 opposite to edge 34a. Platform 50 helps support printed circuit board 34 within cavity 21 at a location spaced from bottom wall 18. In addition, as particularly show in FIG. 4, transition region 46 of contact 22 disposes clip element 42 at a location spaced inwardly from side wall 20. This provides a clearance between clip element 42 and side wall 20. Further, board bearing surface 52 of platform 50 is spaced inwardly from side wall 20. Thus, as positioned in FIG. 4, printed circuit board 34 is positioned centrally within cavity 21 spaced from side walls 20. By spacing printed circuit board 34 away from both bottom wall 18 and side wall 20 of lower housing 14, clearance is provided on all sides of printed circuit board 34 which permits complete encapsulation of electric apparatus 32.

Figure 5:
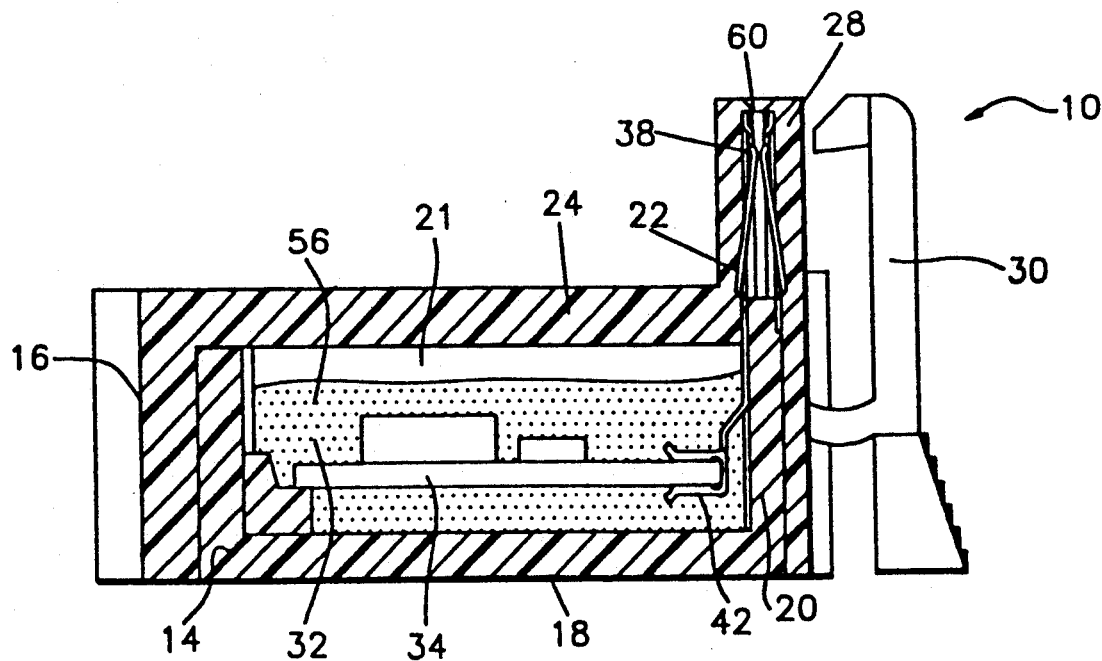
FIG. 5 shows partially in section, the assembled socket connector of FIG. 1.

Referring now to FIG. 5, as electronic apparatus 32, including printed circuit board 34, is spaced both vertically and horizontally away from bottom wall 18 and side wall 20 of lower housing 14, a potting compound 56 may be poured into cavity 21 of lower housing 14 to completely surround electronic apparatus 32 as well as clip elements 42 of contacts 22 which engage printed circuit board 34. Potting compound 56 is of the type which is commonly used and commercially available in the electronics industry to environmentally seal electronic components. It is typically provided in a fluid state so that it may be poured into cavity 21 of lower housing 14, to flow completely around electronic apparatus 32 and clip elements 42 of contacts 22. The potting compound 56 is permitted to cure to a hardened state whereby the electronic apparatus as well as its electrical connection to contacts 22, are environmentally sealed.

Once potting compound 56 hardens or cures, cover 16 may be placed over lower housing 14 to enclose the potted electronic apparatus 32. As shown in FIG. 1, lower housing 14 and cover 16 may include cooperative key element such as a rib 58 on lower housing 14 and a slot 59 on cover 16 to provide keyed-matability between cover 16 and lower housing 14. Extending portion 28 of cover 16 accommodates extending sockets 38 of contacts 22, securely retaining contacts 22 within socket connector 10. Extending portion 28 includes openings 55 adjacent sockets 38 to permit electrical connection to sockets 38.

Figure 6:
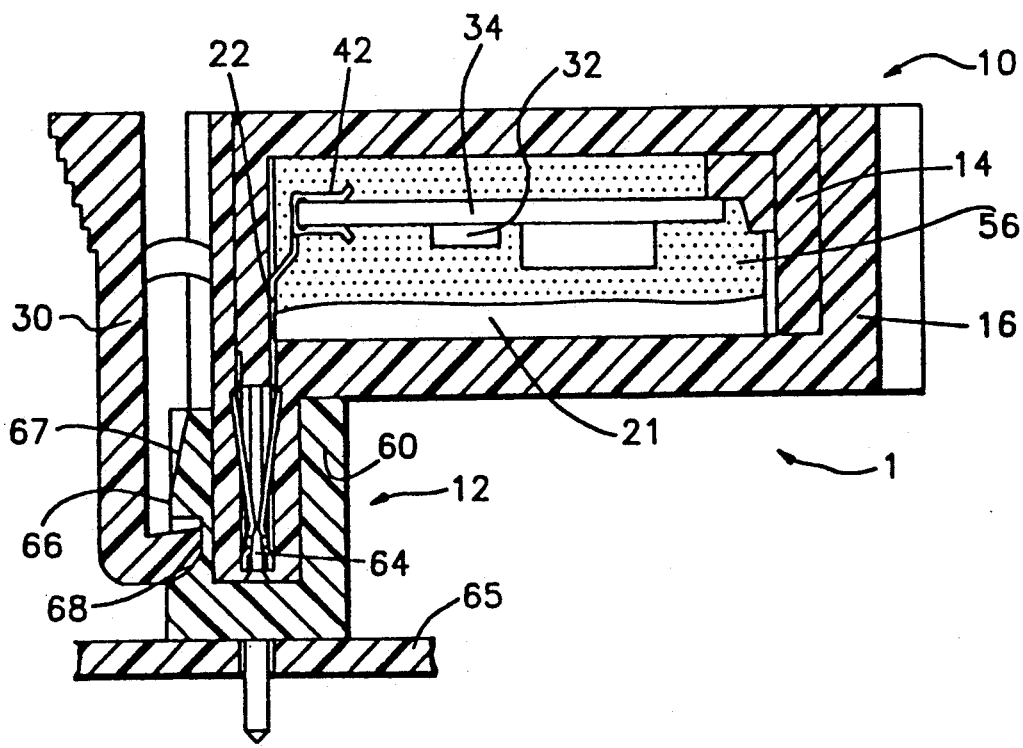
FIG. 6 shows partially in section, the assembled socket connector of FIG. 5 inverted and connected to the header connector shown in FIG. 2.

Referring now to FIGS. 2 and 6, the connection of socket connector 10 to header connector 12 is shown. Header connector 12 includes an elongate insulative body 60, having a central cavity 62 of like shape to that of extending portion 28 of cover 16 which is received therein. The shape of extending portion 28 and cavity 62 provides a keying feature preventing improper connection of socket connection 10 to header contacts 12. Header connector 12 includes a plurality of pin-type contact terminals 64 in number corresponding to the number of contacts 22 in socket connector 10. Header connector 12 includes a latch receiving member 66, which comprises a tapered lead-in portion 67 and a securement portion 68. Latch receiving member 66 is engageable with latch 30 to lock socket connector 10 to header connector 12.

It can be seen that latch 30 is employed by manually pivoting the upper portion of the latch about the hinge which connects it to cover 16. Use in this manner requires that there be sufficient clearance about latch 30 to enable a user to obtain manual access to latch 30 and manipulate it back and forth to lock and release socket connector 10 to header connector 12. It is contemplated that the socket connector 10 and header connector 12 may be employed in areas which have limited access making it difficult to access latch 30 along the side thereof to pivot the latch. This limited access may be found in instances where the header connector 12 is mounted on a printed circuit board 65 (FIG. 6) next to a wall of a housing (not shown) in which the printed circuit board 65 is installed. In such cases there may not be sufficient clearance to provide for the actuation of latch 30.

The present invention further contemplates use of an improved latch design which would facilitate simple releasable connection of socket connector 10 to header connector 12 even in areas of limited access.

Figure 7:
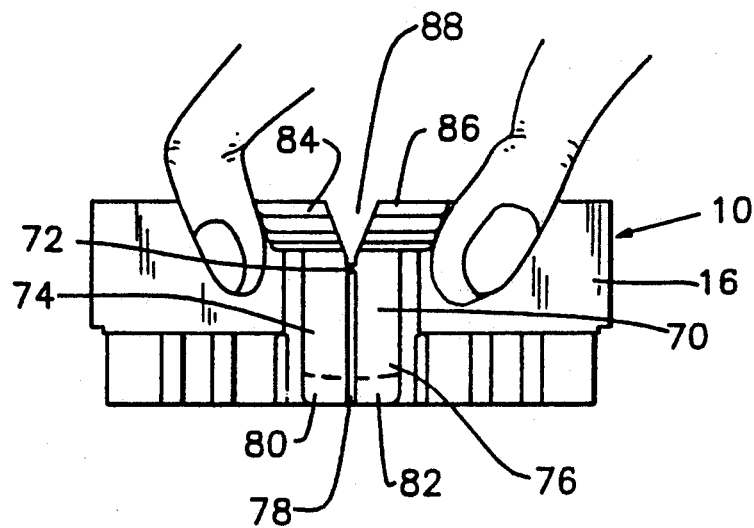
FIG. 7 shows a further embodiment of the socket connector of the present invention.
Figure 8:
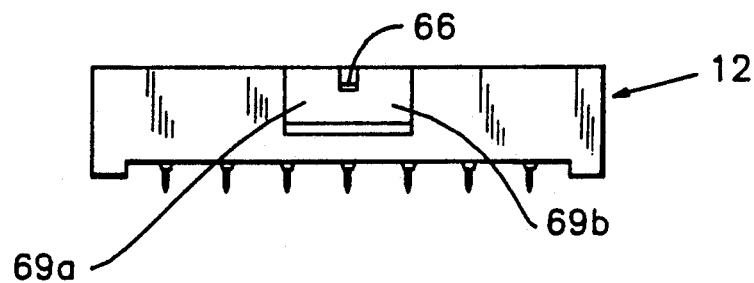
FIG. 8 shows a further embodiment of the header connector of the present invention.
Figure 9:
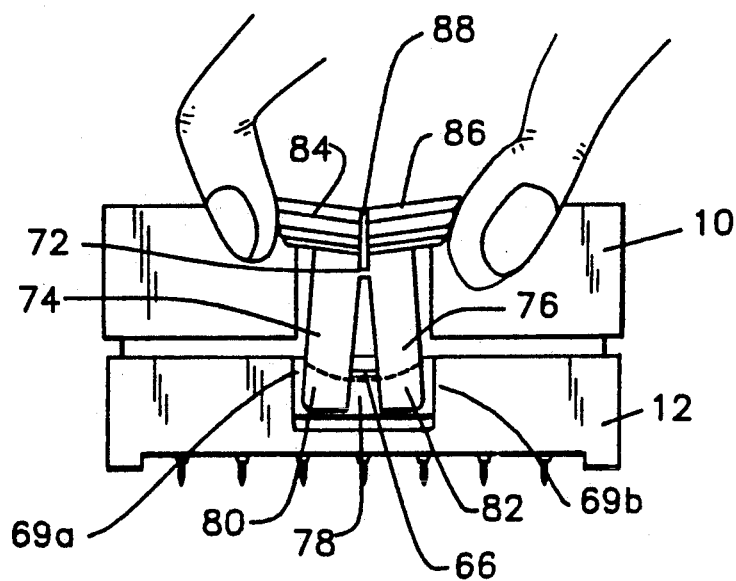
FIG. 9 shows the socket connector of FIG. 7 connected to the header connector of FIG. 8.

Referring now to FIGS. 7-9, cover 16 is shown having an improved latch 70. Latch 70 is connected to cover 16 by an intermediate hinge 72 in a manner similar to that shown in FIGS. 1 and 6 hereinabove. Latch 70 includes a pair of depending latch arms 74 and 76 which depend from hinge 72. Latch arms 74 and 76 are separated by an elongate slot 78 therebetween. The distal extents of latch arms 74 and 76 include engagement ledges 80 and 82 respectively (shown in phantom in FIGS. 7 and 9) which are similar in structure to that shown in FIGS. 5 and 6. Latch 70 also includes a pair of manually graspable tabs 84 and 86 which extend upwardly from hinge 72 as shown in FIG. 7. Tabs 84 and 86 are separated by a V-shaped recess 88 therebetween. The V-shaped recess 88 permits tabs 84 and 86 to be moved toward and away from each other thereby causing opposite corresponding movement of latch arms 74 and 76 toward and away from each other about slot 78. This is in addition to the conventional movement of latch 70 about hinge 72 where tabs 84 and 86 are moved in unison toward and away from cover 16 to cause opposite corresponding movement of latch arms 74 and 76 in unison about hinge 72.

Header connector 12 shown in FIG. 8 is substantially similar to that shown in FIG. 2. The latch receiving member 66 is slightly modified to have a smaller longitudinal extent so as to provide for vertical access through side recesses 69a and 69b on either side thereof.

Referring to FIG. 9 the operation of the latch 70 of the present invention may be described. It is initially contemplated that latch 70 may be employed in conventional fashion. That is, tabs 84 and 86 may be moved in unison toward and away from cover 16 about hinge 72 to cause opposite corresponding movement in unison of depending latch arms 74 and 76. This permits the latch 70 to be used in a manner as shown and described with reference to FIGS. 2 and 6. However, the latch 70 of the present invention may also be employed in a manner particularly shown in FIG. 9, where tabs 84 and 86 may be moved about hinge 72 toward each other to cause a spreading or outward movement of depending latch arms 74 and 76. This in turn permits the ledges 80 and 82 to clear the latch receiving member 66 of header connector 12 thereby permitting the easy removal of socket connector 10 from header connector 12. Thus, where access is limited, the user may merely pinch tabs 84 and 86 together to facilitate removal of socket connector 10 from header connector 12 rather than pivoting the latch 70 back and forth about hinge 72.

Referring again to FIG. 6, header connector 12 is typically mounted to a further printed circuit board 65 in conventional fashion. Socket connector 10 is inverted from its position shown in FIG. 5, so that it may be connected to header connector 12 mounted on printed circuit board 65. Extending portion 28 of cover 16 supporting contacts 22 is inserted into cavity 62 of header connector 12. Electrical connection is established between terminal 64 and socket 38 of each of contacts 22 in conventional pin and socket fashion. Latch 30 engages lead-in portion 67 and snaps into securement portion 68 to lock socket connector 10 to header connector 12. Latch 30 may be manually released in one of the manners described above so that socket connector 10 may be removed from header connector 12.

Socket connector 10 provides an environmental seal to electronic apparatus 32, and therefore may be used in harsh environments such as the engine compartment of an automobile to establish electrical connection between sophisticated electronic components now being used in automobiles.

Various changes to the foregoing described and shown structures would now be evident to those skilled in the art. Accordingly, the particularly disclosed scope of the invention is set forth in the following claims.

I claim:

1. A pair of interconnectable components comprising:
   a first component housing;
   a second component housing interconnectable with said first component housing; and
   cooperating latching means for lockingly securing said first component housing to said second component housing, said latching means comprising:
   a latch member connected to said first housing by a pivotal hinge said latch member including a pair of elongate latch arms extending from said hinge, ends of said arms including engagement ledges thereat, and a pair of manually graspable tabs extending from said hinge in a direction opposite said latch arms, said tabs being movable about said hinge toward and away from one another to cause opposite corresponding relative movement of said ends of said latch arms and being moveable in unison about said hinge toward and away from said first housing to cause opposite corresponding movement in unison of said ends of said latch arms; and
   a ledge engaging protrusion formed on said second housing said ledge engaging protrusion being engagable with said ledges for lockingly securing said first housing to said second housing, said ledges being disengagable with said protrusion upon movement of said tabs about said hinge either toward and away from one another or in unison toward and away from said first housing.

* * * * *